(12) United States Patent
Carta et al.

(10) Patent No.: US 8,895,424 B2
(45) Date of Patent: Nov. 25, 2014

(54) PROCESS FOR FORMING SCHOTTKY RECTIFIER WITH PTNI SILICIDE SCHOTTKY BARRIER

(75) Inventors: Rossano Carta, Turin (IT); Carmelo Sanfilippo, Turin (IT)

(73) Assignee: Siliconix Technology C. V., Singapore (SG)

( * ) Notice: Subject to any disclaimer, the term of this patent is extended or adjusted under 35 U.S.C. 154(b) by 798 days.

(21) Appl. No.: 12/831,098

(22) Filed: Jul. 6, 2010

(65) Prior Publication Data

US 2011/0159675 A1    Jun. 30, 2011

Related U.S. Application Data

(63) Continuation of application No. 11/715,046, filed on Mar. 6, 2007, now Pat. No. 7,749,877.

(60) Provisional application No. 60/779,836, filed on Mar. 7, 2006.

(51) Int. Cl.
    *H01L 29/47* (2006.01)
    *H01L 29/66* (2006.01)
    *H01L 29/872* (2006.01)

(52) U.S. Cl.
    CPC ........ *H01L 29/872* (2013.01); *H01L 29/66143* (2013.01); *H01L 29/47* (2013.01)
    USPC ...................................... 438/581

(58) Field of Classification Search
    USPC .......... 438/570, 580, 581; 257/471, 475, 485, 257/486, 478, E21.001
    See application file for complete search history.

(56) References Cited

U.S. PATENT DOCUMENTS

| | | | |
|---|---|---|---|
| 3,290,127 A | | 12/1966 | Dawon et al. |
| 3,669,730 A | * | 6/1972 | Lepselter ................... 438/570 |
| 3,699,408 A | * | 10/1972 | Shinoda et al. ............. 257/473 |
| 3,740,619 A | * | 6/1973 | Rosvold ..................... 257/753 |
| 3,830,657 A | * | 8/1974 | Farrar ........................ 438/643 |

(Continued)

FOREIGN PATENT DOCUMENTS

| | | | | |
|---|---|---|---|---|
| JP | 56164529 A | * | 12/1981 | ............ H01L 21/28 |
| JP | 2000196108 A | * | 7/2000 | |
| JP | 2003257888 A | * | 9/2003 | |

OTHER PUBLICATIONS

Mantovani et al., "Pt-Ni bilayers on n-type silicon: Metallurgical and electrical behavior." J. Appl. Phys. 55, 4 (1984): pp. 899-908.*

(Continued)

*Primary Examiner* — Michele Fan

(57) ABSTRACT

A process for forming a Schottky barrier to silicon to a barrier height selected at a value between 640 meV and 840 meV employs the deposition of a platinum or nickel film atop the silicon surface followed by the deposition of the other of a platinum or nickel film atop the first film. The two films are then exposed to anneal steps at suitable temperatures to cause their interdiffusion and an ultimate formation of $Ni_2Si$ and $Pt_2Si$ contacts to the silicon surface. The final silicide has a barrier height between that of the Pt and Ni, and will depend on the initial thicknesses of the Pt and Ni films and annealing temperature and time. Oxygen is injected into the system to form an $SiO_2$ passivation layer to improve the self aligned process.

9 Claims, 2 Drawing Sheets

(56) References Cited

U.S. PATENT DOCUMENTS

| | | | | |
|---|---|---|---|---|
| 3,855,612 | A * | 12/1974 | Rosvold | 257/479 |
| 3,938,243 | A * | 2/1976 | Rosvold | 438/571 |
| 3,995,301 | A * | 11/1976 | Magdo | 257/477 |
| 4,110,488 | A * | 8/1978 | Risko | 438/17 |
| 4,206,540 | A | 6/1980 | Gould | |
| 4,224,115 | A * | 9/1980 | Nara et al. | 205/123 |
| 4,307,132 | A * | 12/1981 | Chu et al. | 438/570 |
| 4,316,209 | A * | 2/1982 | Ho et al. | 257/765 |
| 4,322,453 | A | 3/1982 | Miller | |
| 4,569,121 | A * | 2/1986 | Lim et al. | 438/467 |
| 4,637,869 | A * | 1/1987 | Glocker et al. | 204/192.11 |
| 4,752,813 | A * | 6/1988 | Bhatia et al. | 257/479 |
| 4,864,378 | A * | 9/1989 | Tsaur | 257/451 |
| 4,925,812 | A | 5/1990 | Gould | |
| 4,946,803 | A * | 8/1990 | Ellwanger | 438/581 |
| 5,023,482 | A * | 6/1991 | Bellavance | 326/75 |
| 5,027,185 | A * | 6/1991 | Liauh | 257/413 |
| 5,047,367 | A | 9/1991 | Wei et al. | |
| 5,134,085 | A * | 7/1992 | Gilgen et al. | 438/210 |
| 5,320,971 | A * | 6/1994 | Eklund et al. | 438/328 |
| 5,757,008 | A * | 5/1998 | Akagawa et al. | 250/370.08 |
| 5,789,311 | A * | 8/1998 | Ueno et al. | 438/573 |
| 5,795,808 | A * | 8/1998 | Park | 438/301 |
| 5,889,331 | A * | 3/1999 | Bai | 257/768 |
| 6,211,083 | B1 * | 4/2001 | Yang et al. | 438/682 |
| 6,331,466 | B1 * | 12/2001 | Takahashi et al. | 438/268 |
| 6,362,546 | B1 | 3/2002 | Sommerfeld et al. | |
| 6,411,536 | B1 | 6/2002 | Thor et al. | |
| 6,483,164 | B1 * | 11/2002 | Kanemaru et al. | 257/453 |
| 6,624,522 | B2 | 9/2003 | Standing et al. | |
| 7,292,445 | B2 | 11/2007 | Linke | |
| 2004/0063240 | A1 | 4/2004 | Madrid et al. | |
| 2004/0104489 | A1 | 6/2004 | Larking | |
| 2004/0142567 | A1* | 7/2004 | Nakajima et al. | 438/689 |
| 2004/0169262 | A1 | 9/2004 | Oliver et al. | |
| 2005/0242367 | A1* | 11/2005 | Clavelier et al. | 257/107 |
| 2006/0086939 | A1 | 4/2006 | Carta et al. | |
| 2006/0273409 | A1* | 12/2006 | Lee et al. | 257/407 |

OTHER PUBLICATIONS

Finstad, "Silicide Formation with Nickel and Platinum Double Layers in Silicon." Thin Solid Films, 51 (1978): pp. 411-424.*

Han et al., "Ni(Pt)Si Thin Film Formation and Its Electrical Characteristics with Si Substrate." IEEE (2001): pp. 513-516.*

Finstad, "The Formation of NiSi from Ni2si Studied with a Platinum Marker." Thin Solid Films 51 (1978): pp. 391-394.*

Ievlev et al., "Silicide Formation during Heat Treatment of Thin Ni-Pt and Ni-Pd Solid-Solution Films and Pt/Ni Bilayers on (111) Si." Inorganic Materials, 42 (2006): pp. 151-159.*

Qu et al., "Thermal stability, phase and interface uniformity of Ni-silicide formed by Ni-Si solid-state reaction" Thin Solid Films, 462-463 (2004): pp. 146-150.*

Santos et al., "Thermal stability of Ni(Pt) silicide films formed on poly-Si" Microelectronic Engineering, 82 (2005): pp. 485-491.*

Santos et al., "Thermal stability of Ni/Pt silicide films on BF doped and undoped (100)Si" Electrochemical Society Proceedings vol. (2005): pp. 196-203.*

* cited by examiner

PROCESS FOR FORMING SCHOTTKY RECTIFIER WITH PTNI SILICIDE SCHOTTKY BARRIER

RELATED APPLICATIONS

This application is a continuation of co-pending U.S. patent application Ser. No. 11/715,046 filed on Mar. 6, 2007, which claims the benefit and priority to U.S. Provisional Application No. 60/779,836, filed Mar. 7, 2006, the entire disclosure of which is incorporated by reference herein.

FIELD OF THE INVENTION

This invention relates to semiconductor devices and more specifically relates to a novel process for the manufacture of a PtNi Silicide barrier Schottky device.

BACKGROUND OF THE INVENTION

Schottky devices are known which use a PtNi Silicide Schottky barrier. A process for the formation of such barriers in which the barrier height is settable in the range of about 640 meV to about 840 meV would be very desirable.

BRIEF DESCRIPTION OF THE INVENTION

In accordance with the invention, a novel process is provided in which the barrier is formed by a process sequence in which platinum and nickel layers of selected thickness (having Schottky barrier heights of 640 meV and 840 meV respectively) are sequentially deposited on a silicon substrate followed by annealing process at increasing temperatures to activate the interdiffusion process between the barrier metals and the silicon substrate to form a desired silicide Schottky barrier height. The final silicide will have a barrier height between that of the platinum and the nickel.

Thus, the two layers or films of platinum and nickel respectively are sequentially deposited, as by sputtering or the like from two different monolithic targets in the same chamber. In this way, one can define the silicide stoichiometry and the Schottky barrier height by varying the initial film thicknesses and the annealing temperatures and times during the post-deposition thermal process.

The behavior of the silicon/platinum/nickel system for temperatures up to 200° C. is as follows:

The platinum (or nickel) film which is first deposited will, during annealing, start to react, to form a rich metal silicide $Pt_2Si$ or $Ni_2Si$ respectively When all the platinum or nickel (or another suitable metal) is consumed, the second metal (for example, nickel if platinum is the first metal) will then diffuse through the $Pt_2Si$ (or other) film and reaches and reacts with the silicon to form, for example, regions of $Ni_2Si$ (or $Pt_2Si$). The $Ni_2Si$ and $Pt_2Si$ will convert to the stable silicide phase NiSi and PtSi respectively. In the meantime, the silicon reacts with the already formed metal-rich silicide for converting the $Pt_2Si$ (or $Ni_2Si$) in the stable mono-silicide phases PtSi (or NiSi). This produces quite complex structures, formed by a mixture of PtSi and Nisi, and characterized by different compounds at the silicon surface.

In addition to the reaction at the silicon surface, some silicide of the external metal (e.g. the platinum) is formed at the outer interface with the inner metal silicide, implying the transport of the silicon with the nickel or platinum. If the anneal continues for a longer time, or at a higher temperature, a pseudo binary solid solution [Si(NiPt)] is formed.

The inter-diffusion process between the barrier metals and the silicon depends on the polycrystalline structure of the two films; on the thicknesses of the two films; the annealing temperatures and times and the physical vapor deposition conditions of the platinum and nickel barrier metals.

To improve a self-stopping silicide process formation, oxygen is preferably injected into the reaction area during annealing to form a silicon dioxide passivation layer at the outer silicide surface. This passivation layer helps to protect the silicide surface during a subsequent unmasked wet etch, for example, with aqua regia at about 54° C. of the unreacted bather metals, leaving the Schottky silicide barrier just in the active area of the device.

To improve a self-stopping silicide process formation, oxygen is preferably injected into the reaction area during annealing to form a silicon dioxide passivation layer at the outer silicide surface. This passivation layer helps to protect the silicide surface during a subsequent unmasked wet etch, for example, with aqua regia at about 54.degree. C. of the unreacted barrier metals, leaving the Schottky silicide barrier just in the active area of the device.

DETAILED DESCRIPTION OF THE DRAWINGS

Figure 1:
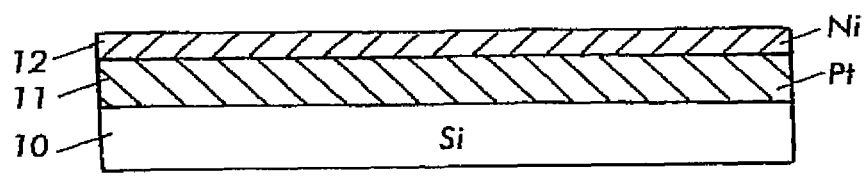
FIG. 1 shows a silicon wafer having layers or films of platinum and nickel sequentially deposited thereon.

FIG. 1 shows a mono-crystalline silicon wafer 10 having parallel upper and lower surfaces. A film of platinum 11 is first deposited atop wafer 10 and a second film 12 of nickel is deposited atop film 11. Films 11 and 12 are preferably deposited in a common chamber by sputtering from respective targets.

Other metals then platinum and nickel can be used. The device to be formed is a Schottky bather rectifier of any desired topology (planar or trench).

Other metals than platinum and nickel can be used. The device to be formed is a Schottky barrier rectifier of any desired topology (planar or trench).

In general, both the Pt film and Ni film can vary in thickness between 100 Å to 5000 Å to chose a desired barrier height between 650 to 840 meV.

Figure 2:
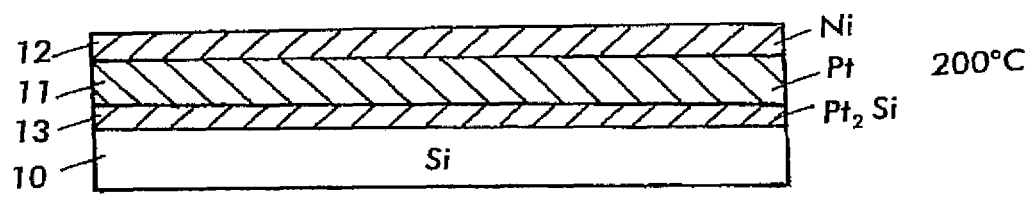
FIG. 2 shows the wafer of FIG. 1 after an anneal process at 200° C. for a given time to cause the formation of a platinum silicide at the silicon surface.

In the next process step, shown in FIG. 2, an anneal temperature of 200° C. is applied, causing a reaction at the Si surface to create a $Pt_2Si$ silicide 13, resulting in a barrier height close to the upper range (820 to 840 meV). This reaction continues for the time needed to consume and convert all of the platinum film 11 to the Pt$_2$Si layer 13.

Figure 3:
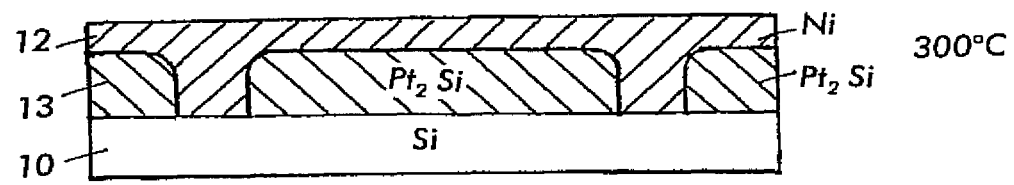
FIG. 3 shows another silicide process formation of the invention with the anneal temperature at 300° C. for a given time to cause the Ni to penetrate the fully formed $Pt_2Si$ layer and reaching the silicon surface at spaced locations.

In FIG. 3, an anneal temperature of 300° C. is used to cause the Ni film to infiltrate through the Pt$_2$Si film 13 and reach the silicon surface forming Ni$_2$Si and giving a barrier height lower than the 200° C. process.

Figure 4:
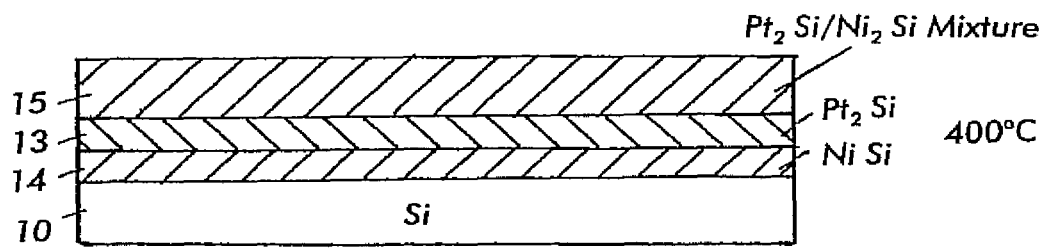
FIG. 4 shows another process using an anneal temperature of 400° C. with a NiSi layer reaching the silicon surface and a mixture of $Pt_2Si$/NiSi at the top of the wafer.

If the anneal temperature is again raised, as shown in FIG. 4 and the nickel now fully infiltrates the Pt$_2$Si film 13, forming NiSi layer 14. In addition, a Pt$_2$Si/N$_2$Si mixture layer 15 is formed atop the Pt$_2$Si layer 13. The obtained barrier height is in the range of 640 to 840 meV.

Figure 5:
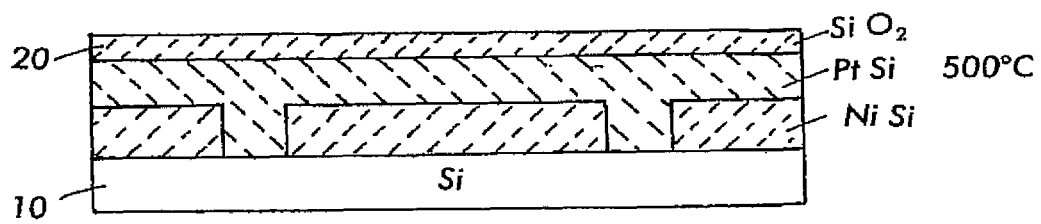
FIG. 5 shows another process of forming the silicide in which the anneal temperature is raised to 500° C. for a given time in which both NiS and $Pt_2Si$ layers are at the silicon surface to create the desired Schottky barrier height (790 to 800 meV) and (optionally) a $SiO_2$ layer is grown atop the silicide film to protect the silicon surface since; continuing the reaction will form a homogeneous SiNiPt film (700 meV).
Figure 6:
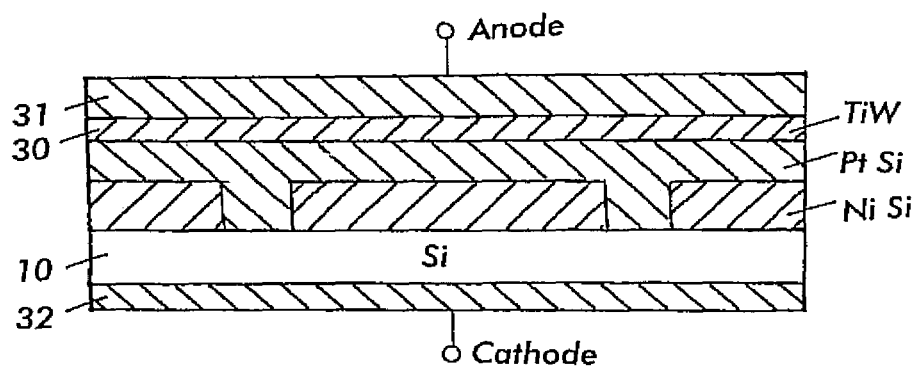
FIG. 6 shows the step of applying the anode and cathode metals to the top and bottom respectively of the wafer.

If the inter-diffusion process is continued at about 500° C. to complete the desired silicide barrier in FIG. 5 with a barrier height of about 790 to 800 meV is obtained and the stable PtSi and NiSi phases are obtained. At the end of this process, oxygen is injected into reaction chamber during ramp-down of the reaction chamber to form the SiO$_2$ layer 20 atop the silicide layer As next shown in FIG. 6, the surface of the device is cleaned as with dilute HF to remove the layer 20, followed by the deposition of a layer of titanium tungsten 30 and a top contact anode metal 31 and a bottom cathode metal 32. The titanium/tungsten layer acts as a barrier between the Schottky barrier and the anode metal 31.

The wafer is next masked and the metallization and barrier are sequentially etched as usual.

Although the present invention has been described in relation to particular embodiments thereof, many other variations and modifications and other uses will become apparent to those skilled in the art. It is preferred, therefore, that the present invention be limited not by the specific disclosure herein.

What is claimed is:

1. A process of forming a Pt/Ni Schottky barrier, comprising the steps of:
   depositing one of a Pt or Ni film of given thickness atop a silicon wafer surface;
   then depositing the other of a Pt or Ni film of given thickness atop the first deposited film;
   thereafter annealing said films to cause the inter diffusion of Pt and Ni, and the growth of areas of nickel and platinum silicides at the silicon surface to define a Schottky junction barrier in the range of 640 meV to 840 meV;
   forming a SiO$_2$ passivation layer atop said silicide after said annealing; and
   removing said SiO$_2$ passivation layer to expose the top surface of said silicide and thereafter applying a layer of TiW atop said silicide.

2. The process of claim 1, wherein said given thicknesses of said Pt and Ni films are in the range of 100 angstroms to 5000 angstroms, and wherein the barrier height of said junction depends on the thicknesses chosen for said Ni and Pt films and annealing temperature and time.

3. The process of claim 1, wherein said annealing of said films comprises annealing at a selected temperature and time.

4. The process of claim 3, wherein said anneal is in the range of 200° C. to 650° C. to obtain the desired barrier height.

5. The process of claim 4, which comprises the further step of applying an anode contact layer atop said layer of TiW.

6. A process of forming a Schottky barrier to the surface of a silicon wafer comprising the steps of:
   depositing a first barrier forming metal of thickness between 500 angstroms to 5000 angstroms atop said surface of said silicon wafer;
   depositing a second barrier forming metal of thickness between 100 angstroms to 5000 angstroms atop said first barrier forming metal;
   thereafter annealing said first and second metals to cause their interdiffusion and the growth of areas of silicides of said first and second metals on said silicon surface to define a Schottky junction barrier of a height dependent on the initial thicknesses chosen for said first and second metals and their thermal treatment;
   forming a SiO$_2$ passivation layer atop said silicide after said annealing; and
   removing said SiO$_2$ passivation layer to expose the top surface of said silicide and thereafter applying a layer of TiW atop said silicide.

7. The process of claim 6, wherein said first and second metals are Pt and Ni respectively, and wherein said barrier height is in the range of 640 meV to 840 meV.

8. The process of claim 6, wherein said annealing of said metals is carried out at a preselected temperature for a preselected time to produce a predetermined barrier height.

9. The process of claim 8, wherein said anneal steps are carried out at a temperature range of 200° C. to 650° C. respectively.

* * * * *